(12) United States Patent
Huang

(10) Patent No.: US 7,036,566 B1
(45) Date of Patent: May 2, 2006

(54) HEAT DISSIPATING MODULE

(76) Inventor: Tsung-Hsien Huang, No. 18-28, Ta Hu Rd., Hu Pei Village, Yuan Shan Hsiang, I-Lan County (TW)

( * ) Notice: Subject to any disclaimer, the term of this patent is extended or adjusted under 35 U.S.C. 154(b) by 0 days.

(21) Appl. No.: 11/163,139

(22) Filed: Oct. 6, 2005

(51) Int. Cl.
*F28D 15/00* (2006.01)

(52) U.S. Cl. .............................. 165/104.33; 165/80.3; 165/104.21; 257/714; 361/697; 361/704; 174/15.2

(58) Field of Classification Search ........... 165/104.33, 165/104.21, 104.26, 185, 80.3; 361/697, 361/700, 704; 257/714–716; 174/15.2
See application file for complete search history.

(56) References Cited

U.S. PATENT DOCUMENTS

| | | | | |
|---|---|---|---|---|
| 3,387,653 A | * | 6/1968 | Coe ............................ | 165/165 |
| 5,509,465 A | * | 4/1996 | Lai ............................ | 165/80.3 |
| 5,826,645 A | * | 10/1998 | Meyer et al. .......... | 165/104.33 |
| 5,950,721 A | * | 9/1999 | Bock et al. ................. | 165/185 |
| 5,983,995 A | * | 11/1999 | Shutou et al. ......... | 165/104.33 |
| 6,102,110 A | * | 8/2000 | Julien et al. ........... | 165/104.33 |
| 6,189,213 B1 | * | 2/2001 | Kimura et al. ......... | 29/890.035 |
| 6,758,262 B1 | * | 7/2004 | Kawabata et al. ......... | 165/80.3 |
| 6,779,595 B1 | * | 8/2004 | Chiang .................... | 165/104.33 |
| 6,827,136 B1 | * | 12/2004 | Liu ........................ | 165/104.33 |
| 6,956,740 B1 | * | 10/2005 | Shimura et al. ............ | 361/700 |
| 2004/0257770 A1 | * | 12/2004 | Hu .............................. | 361/704 |
| 2005/0066487 A1 | * | 3/2005 | Zhang ......................... | 24/457 |
| 2005/0103474 A1 | * | 5/2005 | Lee et al. ............... | 165/104.33 |

* cited by examiner

*Primary Examiner*—Terrell Mckinnon
(74) *Attorney, Agent, or Firm*—Pai Patent & Trademark Law Firm; Chao-Chang David Pai

(57) ABSTRACT

A heat dissipating module is disclosed, which comprises a plurality of fins having same or different shapes, a plurality of heat dissipating tubes, and a seat. The fins are stacked one next to another, each fin having a plurality of upper penetrating holes and a plurality of lower grooves or holes. The seat is formed of solid metal with a plurality of slots, each slot corresponding to the lower groove of the fin and having two upper sides extended with two shaping sheets. When the two shaping sheets are pressed and bent, they form a round hole with the slot for receiving a heat dissipating tube. This invention will result in improved heat dissipation.

10 Claims, 9 Drawing Sheets

HEAT DISSIPATING MODULE

BACKGROUND OF THE INVENTION (a) Field of the Invention

The present invention relates to a heat dissipating module having heat dissipating tubes and a seat. More particularly, it relates to such a heat dissipating module without using tin glue or other welding agents for combining the heat dissipating tubes and the seat. Thus higher heat dissipating efficiency between the heat dissipating tubes and the seat can be achieved.

(b) Description of the Prior Art

Referring to FIG. 13, a conventional heat dissipating module includes a plurality of fins (made of a metal such as aluminum or copper), a plurality of heat dissipating tubes 20 (both ends of which are sealed with working liquid contained therein) and a seat 30 (made of a metal such as copper, thus also called a copper seat). The heat dissipating fins are stacked one next to another. The heat dissipating tubes pass through the fins and the heat dissipating tubes are welded to the seat by tin glue or other selected welding agents. If the heat dissipating tubes 20 and the seat 30 are made of different materials, nickel needs to be electroplated thereto. Therefore, the whole assembly work is complex and the cost high, while the yield ratio is low. Moreover, the heat dissipating efficiency between the heat dissipating tubes 20 and seat 30 is low.

In use, the prior art heat dissipating module is enclosed by a fan locking frame for locking a frame.

SUMMARY OF THE INVENTION

It is an objective of the present invention to provide a heat dissipating module, which, when compared with the prior art module, can be more easily assembled at a higher yield ratio and can result in a higher heat dissipating efficiency. To achieve this objective, the present invention provides a heat dissipating module comprising a plurality of fins having same or different shapes, a plurality of heat dissipating tubes, and a seat made of solid metal. The plurality of fins are stacked one next to another; each fin has a plurality of upper penetrating holes; the upper penetrating holes of the fins are aligned to form a plurality of through holes; and a lower side of each fin has a plurality of trenches. The plurality of heat dissipating tubes are sealed at both ends with working liquid filled in the tubes. One end surface of the seat is formed with a plurality of slots corresponding to the trenches of the fins; two upper sides of each slot are extended with two shaping sheets, which can be pressed and bent to form a round hole with the slot. The lower legs of the plurality of heat dissipating tubes can be embedded in the slots of the seat and then the two shaping sheets are pressed and bent to tightly fold around the lower legs of the heat dissipating tubes. The lower legs of the heat dissipating tube pass through the upper penetrating holes and the upper legs of the heat dissipating tube pass through the trenches so that the fins are tightly pressed to the seat. Thereby heat can be transferred through the seat, the heat dissipating tubes and the fins to be dissipated. Thus a heat dissipating module is formed.

Another object of the present invention is to provide a heat dissipating module, wherein the fins can be divided into four sections which are arranged one next to another. The fins in a first section has upper penetrating holes and lower semi-circular grooves. The fins in a second section has upper penetrating holes and lower penetrating holes. The fins in a third section are identical to the fins in the first section. The fins in the fourth section are short and thus have only upper penetrating holes. Since the fins in the second section have upper penetrating holes and lower penetrating holes, the heat dissipating tubes can pass through the fins. The heat dissipating tubes press on the first and third sections so that all the heat dissipating fins are tightly engaged with the seat. Thereby heat can be transferred through the seat, heat dissipating tubes and the fins (and optionally an external heat dissipating fan) so as to achieve improved heat dissipating effect.

Moreover, the trenches of the plurality of fins can be semi-cambered grooves, semi-elliptical grooves, or flat notches. The slots of the seat can be semi-cambered slots, semi-elliptical slots, or flat notches.

DETAILED DESCRIPTION OF THE PREFERRED EMBODIMENTS

In order that those skilled in the art can further understand the present invention, a detailed description of the preferred embodiments will be provided in the following. The description and the appended drawings is provided only to enable those skilled in the art to understand the objects, features, and characteristics of the present invention, but not to be used to confine the scope and spirit of the present invention defined in the appended claims.

Figure 1:
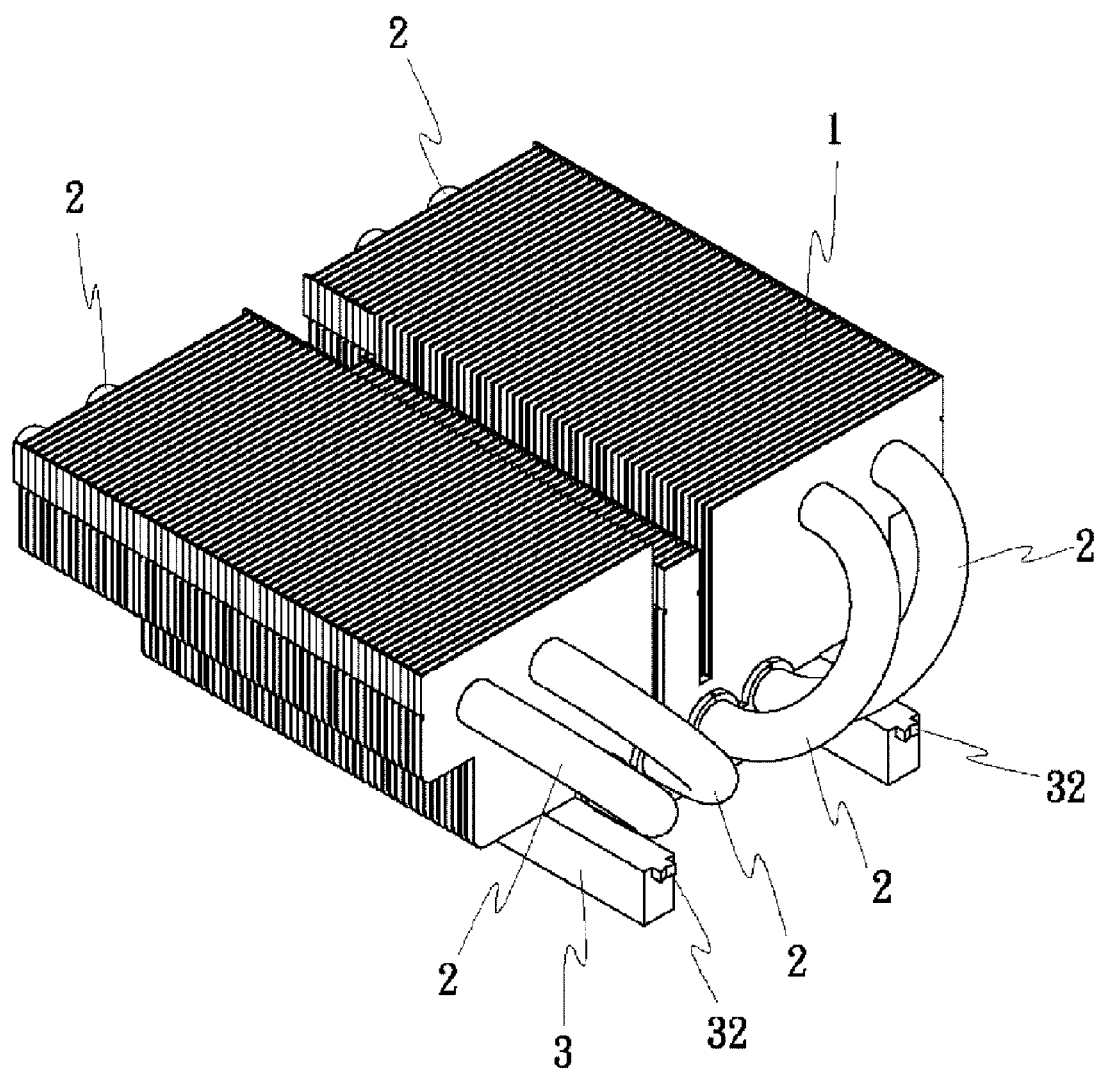
FIG. 1 is an assembled perspective view of an embodiment of the present invention.
Figure 2:
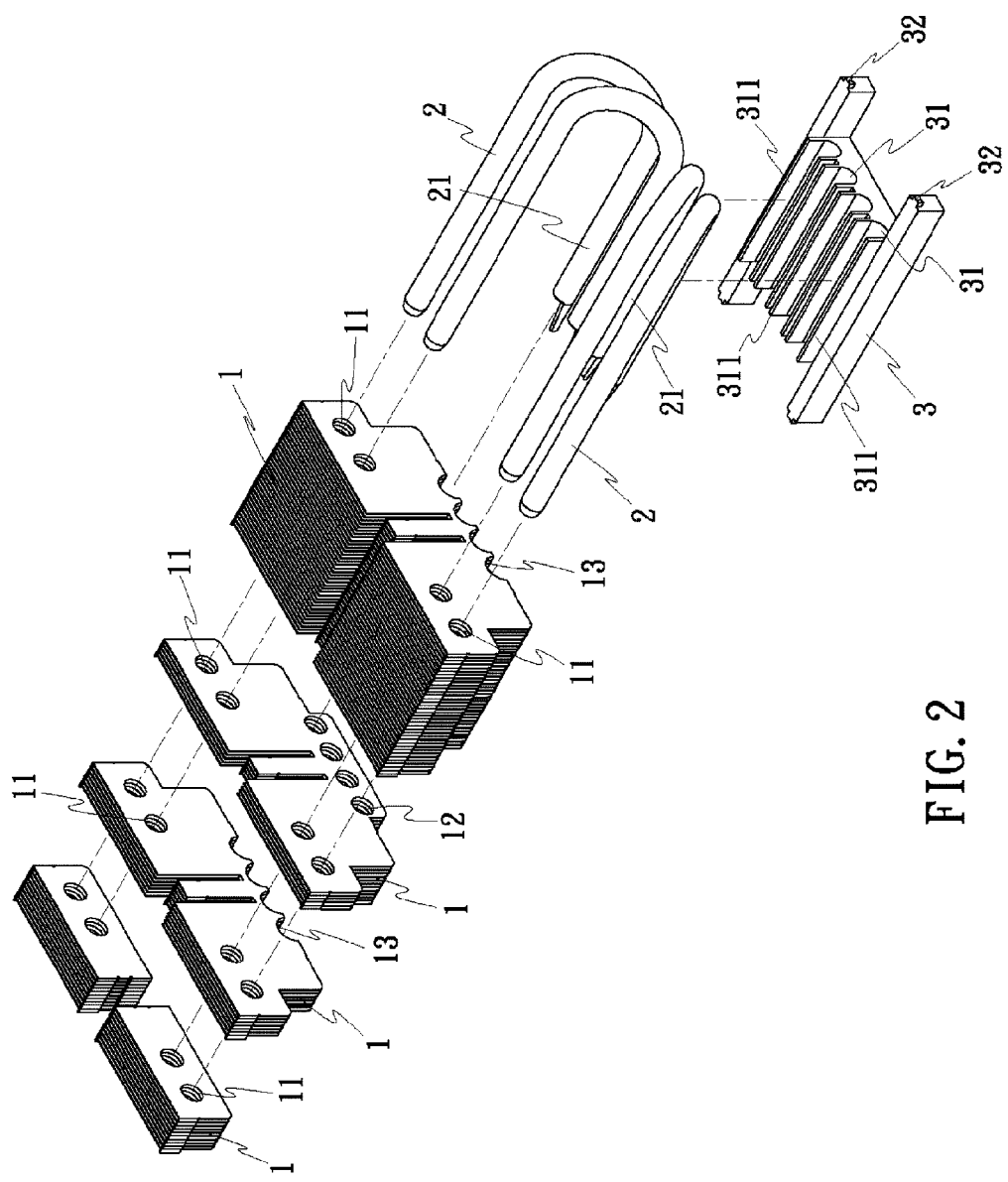
FIG. 2 is an exploded perspective view of the embodiment shown in FIG. 1.

Referring to FIGS. 1 and 2, the heat dissipating module of the present invention has the following elements: a plurality of fins 1 having same or different shapes; a plurality of heat dissipating tubes 2; and a seat 3 made of solid metal (such as copper).

The fins 1 are stacked one next to another. Each fin 1 has a plurality of upper penetrating holes 11. The upper penetrating holes 11 of the fins 1 are aligned to form a plurality of through holes across the fins. Each of the fin 1 (except those in a last section) has at its lower side a plurality of lower penetrating holes 12 or a plurality of lower semi-circular grooves 13.

Each of the plurality of heat dissipating tubes 2 is formed with a curved section and two legs (a lower leg 21 and an upper leg) and is sealed at both ends with working liquid filled in the tubes.

One end surface of the seat 3 is formed with a plurality of slots 31 (such as semi-circular slots 31) corresponding to the lower penetrating holes 12 or the lower semi-circular grooves 13 of the fins 1. Two upper sides of each slot 31 are extended in the form of two shaping sheets 311. As the two shaping sheets 311 are pressed and bent, they form a round hole with the slot 31. The diameter of the round hole is equal to that of the heat dissipating tube 2.

Further, the lower legs of the plurality of heat dissipating tubes 2 can be embedded in the semi-circular slots 31 of the seat 3 and then the two shaping sheets 311 at two ends of the semi-circular slots 31 are pressed and bent to tightly fold around the lower legs of the heat dissipating tubes 2. The lower legs 21 of the heat dissipating tubes 2 pass through the upper penetrating holes 11 and the upper legs of the heat dissipating tubes 2 pass through the lower penetrating holes 12 or the lower semi-circular grooves 13 so that the fins 1 are tightly attached to the seat 3. Thereby heat can be transferred through the seat 3, heat dissipating tubes 2 and the fins 1 (and optionally an external heat dissipating fan) to be dissipated. Thus a heat dissipating module is formed. No welding process is used in assembling the seat 3 and the heat dissipating tube 2. The assembly is quick and can be performed without welding glue or adhesive. Thus the heat dissipating efficiency of the module is enhanced.

Figure 3:
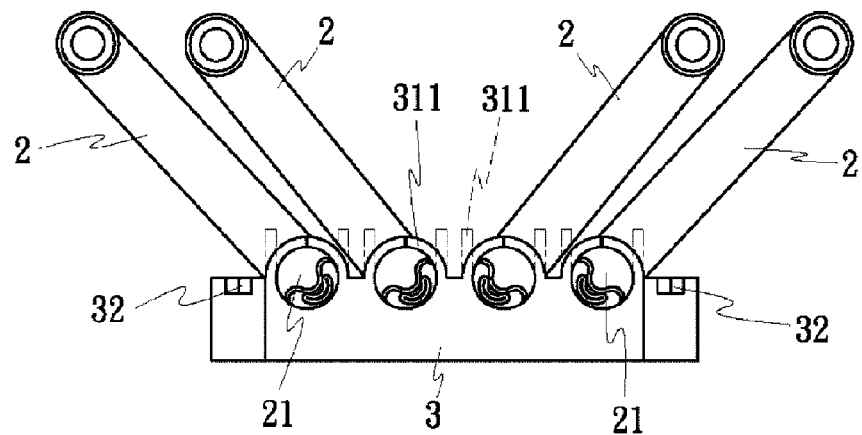
FIG. 3 is an assembled schematic view showing the assembly of the heat dissipating tubes and the seat of the present invention.
Figure 4:
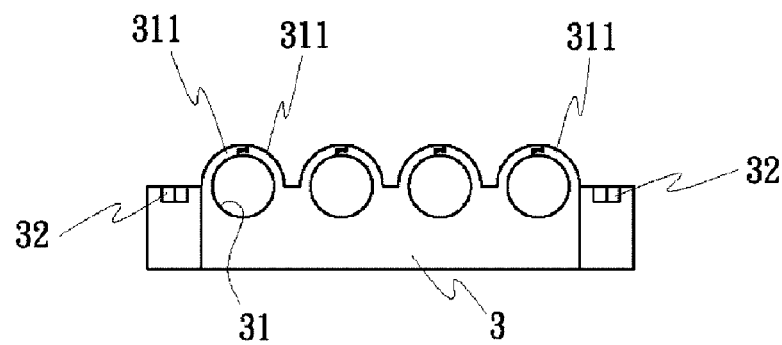
FIG. 4 is another assembled schematic view showing the assembly of the heat dissipating tubes and the seat of the present invention.
Figure 5:
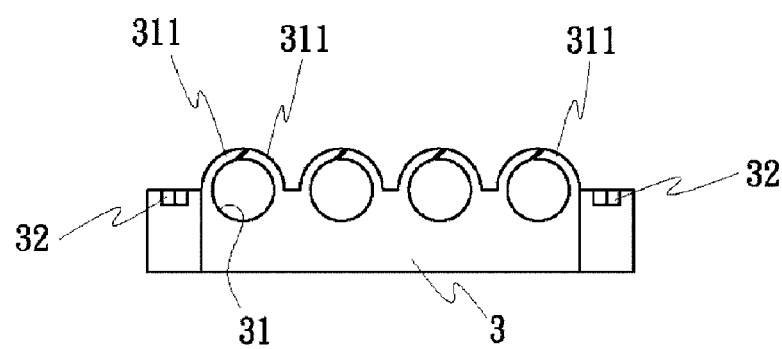
FIG. 5 is yet another assembled schematic view about the assembly of the heat dissipating tubes and the seat of the present invention.

The combination of the two sheets 311 for the heat dissipating tubes 2 and the seat 3 is done with a flat surface (referring to FIG. 3). The two sheets 311 are bent to form a round hole with diameter corresponding to that of the heat dissipating tubes 2. See FIG. 4, the combination of the two can also be done with a stepped structure, or as illustrated in FIG. 5, with two inclined surfaces.

Figure 6:
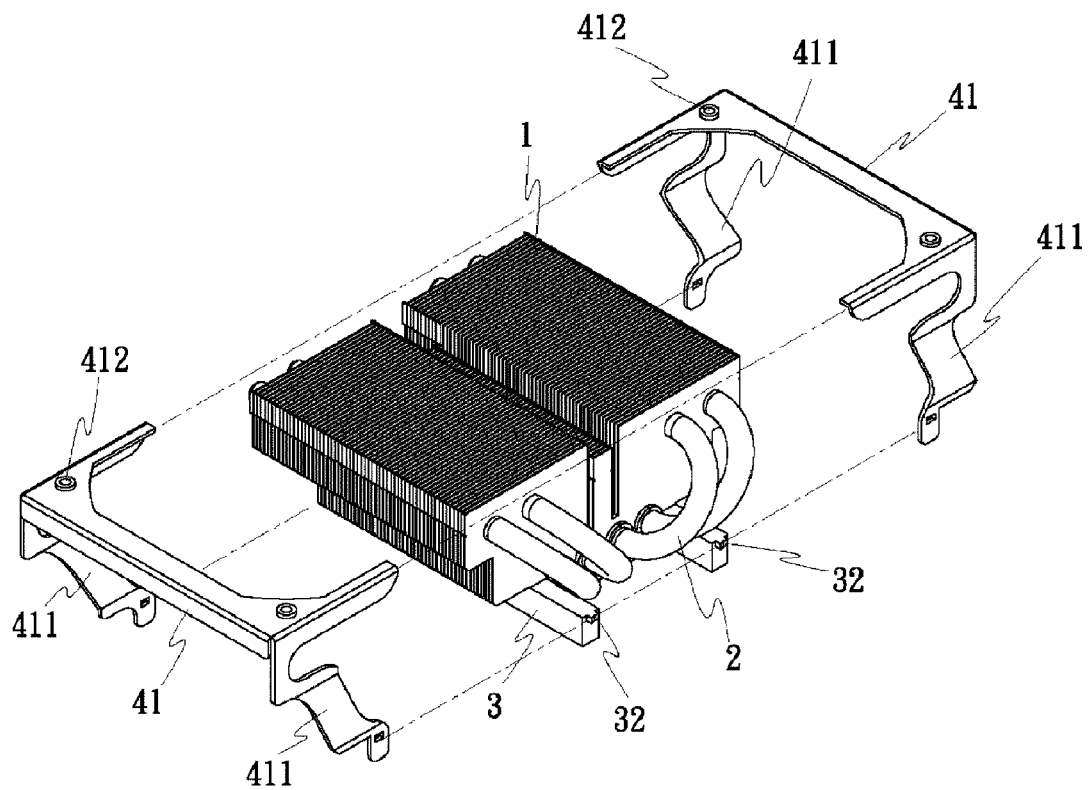
FIG. 6 is an exploded perspective view showing a heat dissipating module of the present invention enclosed with a fan locking frame.
Figure 7:
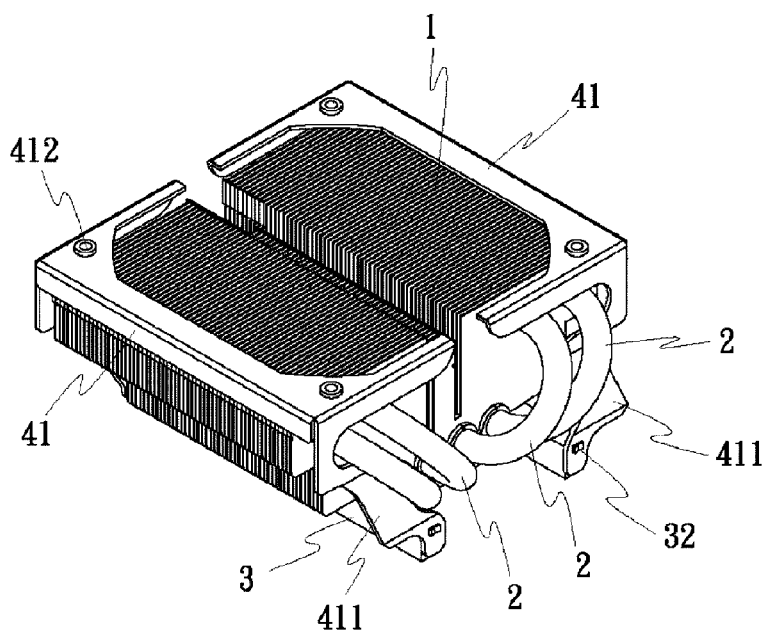
FIG. 7 is an assembled perspective view of FIG. 6.

Referring to FIGS. 6 and 7, the periphery of the heat dissipating fins 1 can be installed within a fan locking frame for locking a fan. The fan locking frame is formed with two semi-frames 41. Each semi-frame has a lower support 411 for fixing to one of connection portions 32 respectively disposed at two sides of the seat 3. Each of the four corners of the locking frame has a respective locking hole 412.

Figure 8:
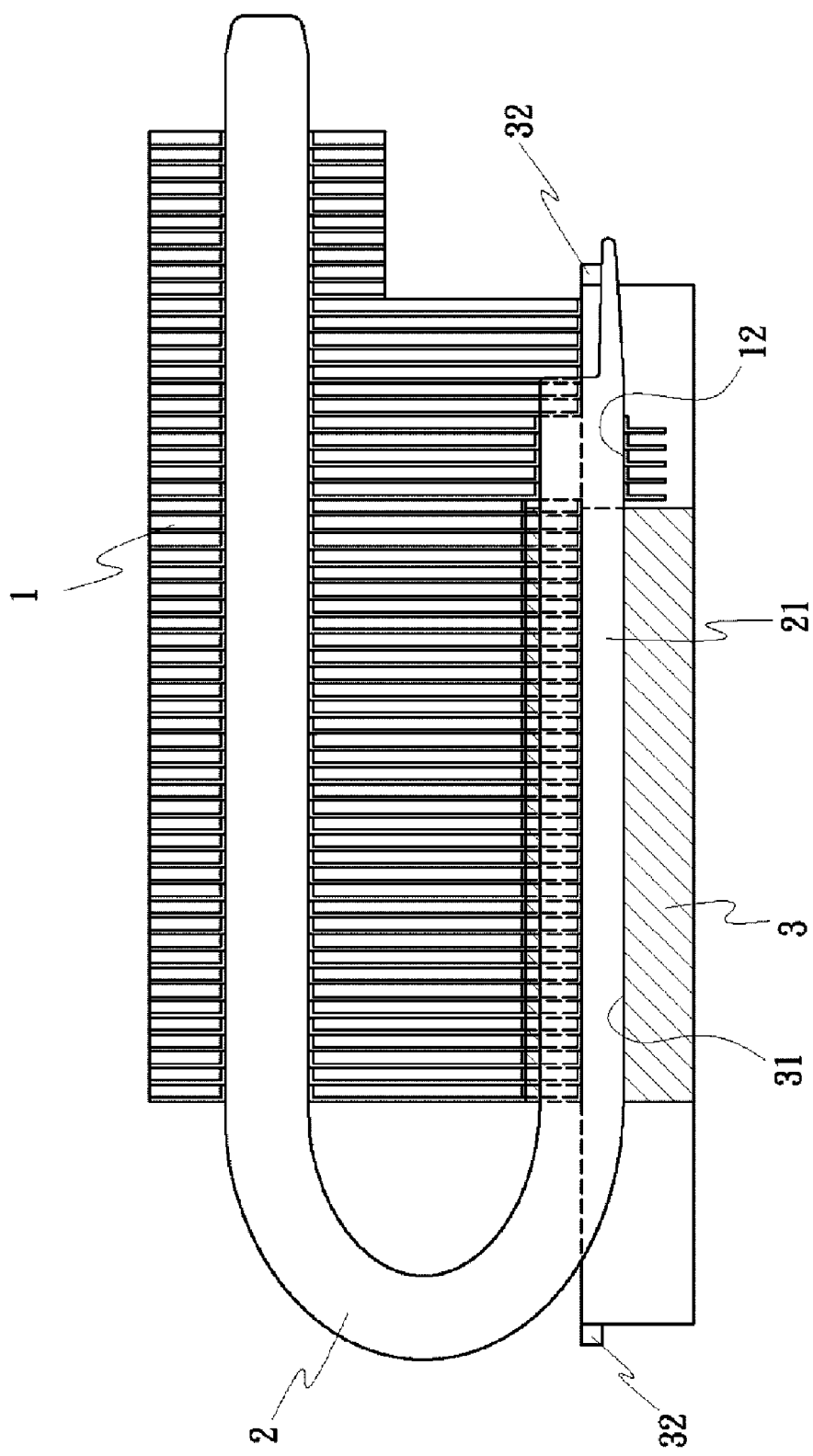
FIG. 8 is a lateral view of a heat dissipating module of the present invention.

Moreover, as illustrated in the drawings, the fins 1 can be divided into four sections (referring to FIGS. 2 and 8). The fins 1 in a first section has upper penetrating holes 11 and lower semi-circular grooves 13. The fins 1 in a second section have upper penetrating holes 111 and lower penetrating holes 12. The fins 1 in a third section are identical to the fins 1 in the first section. The fins 1 in the fourth section are short and thus have only upper penetrating holes 11. Since the second section has the upper penetrating holes 11 and lower penetrating holes 12, the heat dissipating tubes 2 can pass through the fins. The heat dissipating tubes press on the first and third sections (which have no lower penetrating hole) so that all the heat dissipating fins (except those in the fourth section) are tightly engaged with the seat 3. Thereby heat can be transferred through the seat 3, the heat dissipating tubes 2 and the fins 1 (and optionally an external heat dissipating fans), resulting in improved heat dissipating effect.

In the embodiment described above, the heat dissipating tubes are round tubes. Therefore the slots 31 and grooves 13 are semi-circular. After the two shaping sheets 311 are pressed and bent, they tightly fold around round tubes for clamping the heat dissipating tubes 2.

Figure 9:
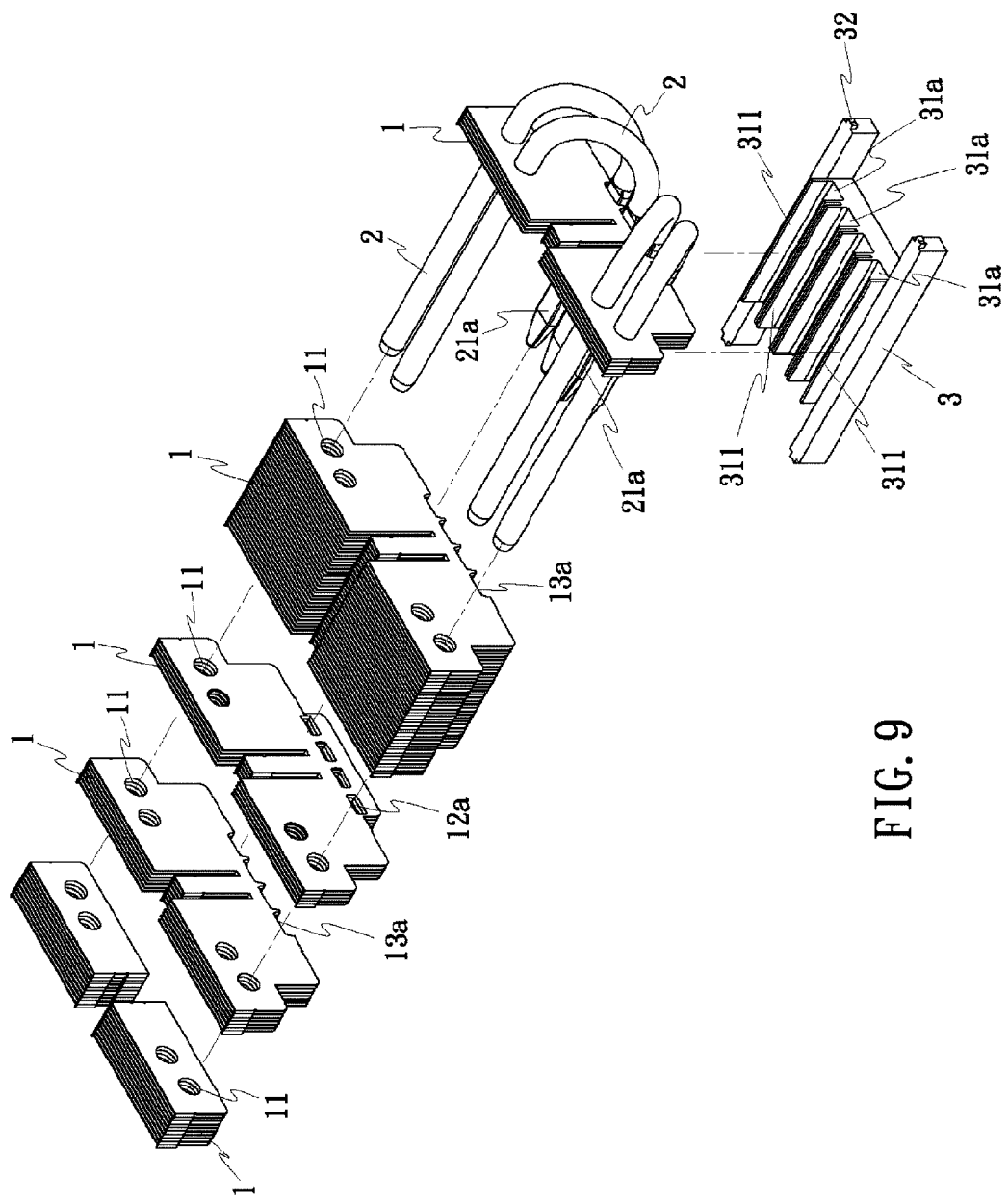
FIG. 9 is an exploded perspective view of another embodiment of the present invention, wherein the heat dissipating tubes are formed with flat surfaces.
Figure 10:
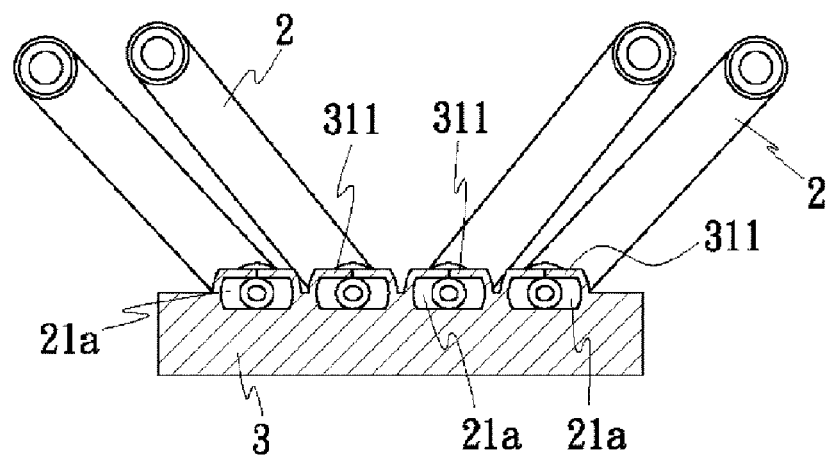
FIG. 10 is a cross sectional view showing the assembly of the heat dissipating tubes and the seat of the embodiment shown in FIG. 9.

Similarly, as illustrated in FIGS. 9 and 10, to tightly enclose the heat dissipating tubes 2 in order to achieve improved heat dissipating effect, the tube body of each heat dissipating tube 2 can be formed with a flat lower leg 21a and the seat 3 can be formed with corresponding flat slots 31a. The fins 1 are formed with corresponding flat notches 13a and flat lower penetrating holes 12a. The shaping sheets 311 can be pressed and bent to tightly fold around the flat lower leg 21a so that the heat dissipating tube 2 is tightly enclosed by the seat 3. The notch 13a of the fin 1 is therefore in close contact with the flat lower leg 21a of the heat dissipating tube 2.

Figure 12:
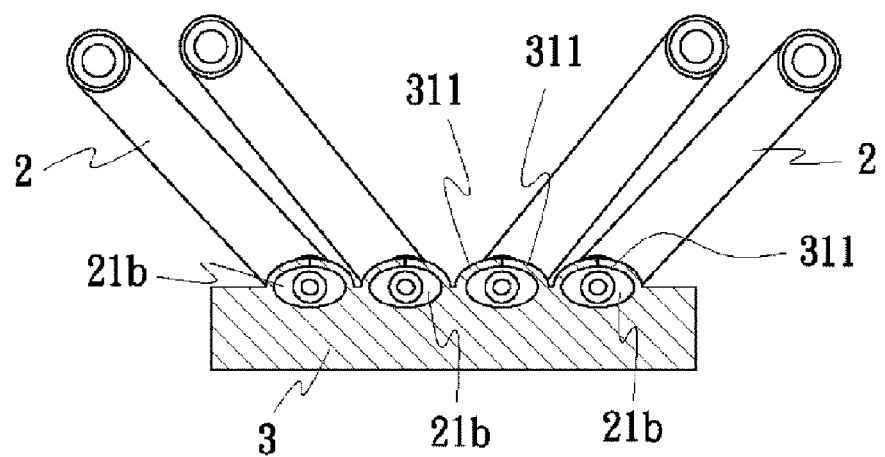
FIG. 12 is a cross sectional view showing the assembly of the heat dissipating tubes and the seat of the embodiment shown in FIG. 11.
Figure 11:
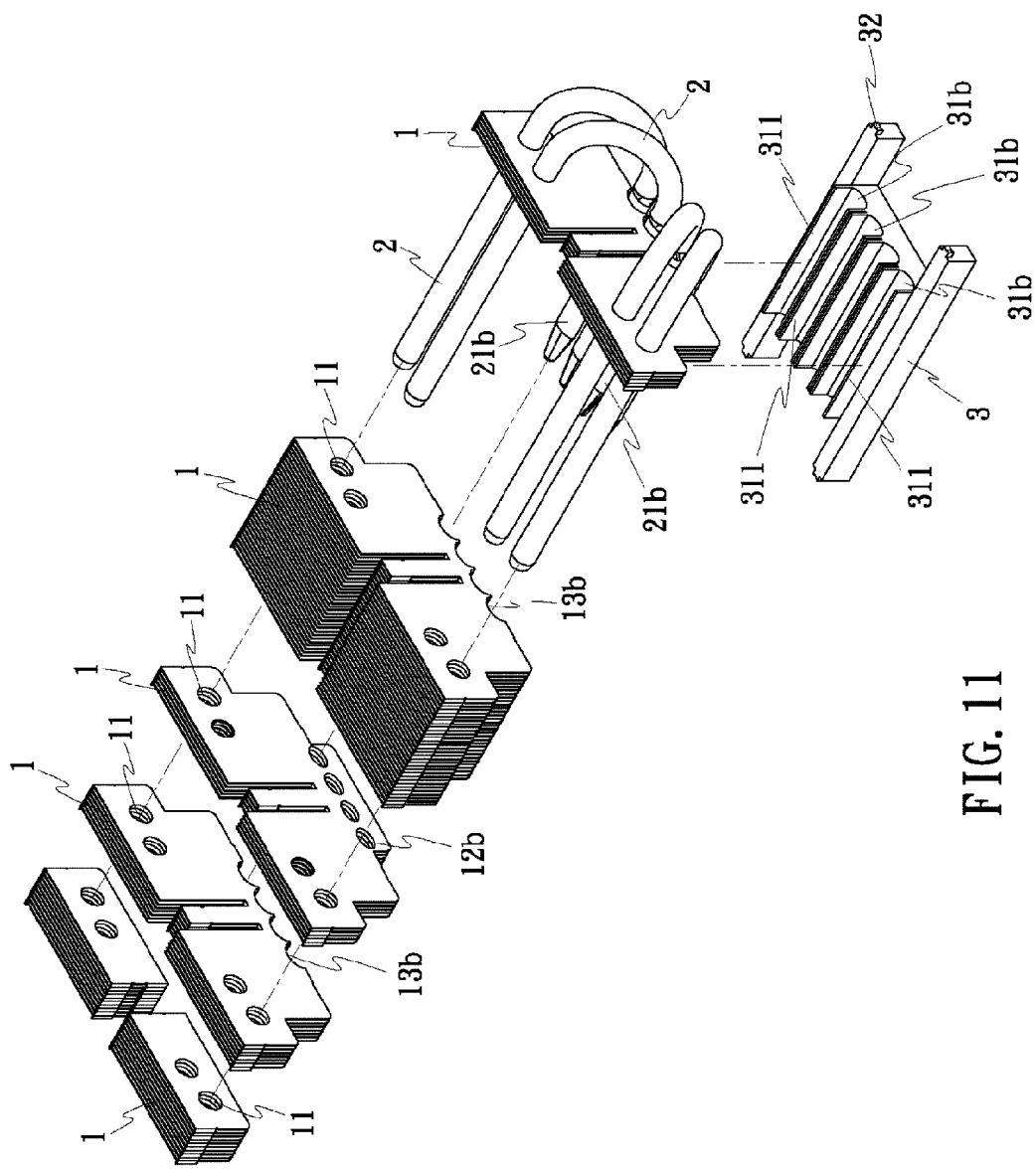
FIG. 11 is an exploded perspective view of yet another embodiment of the present invention, wherein the heat dissipating tubes are elliptical tubes.
Figure 13:
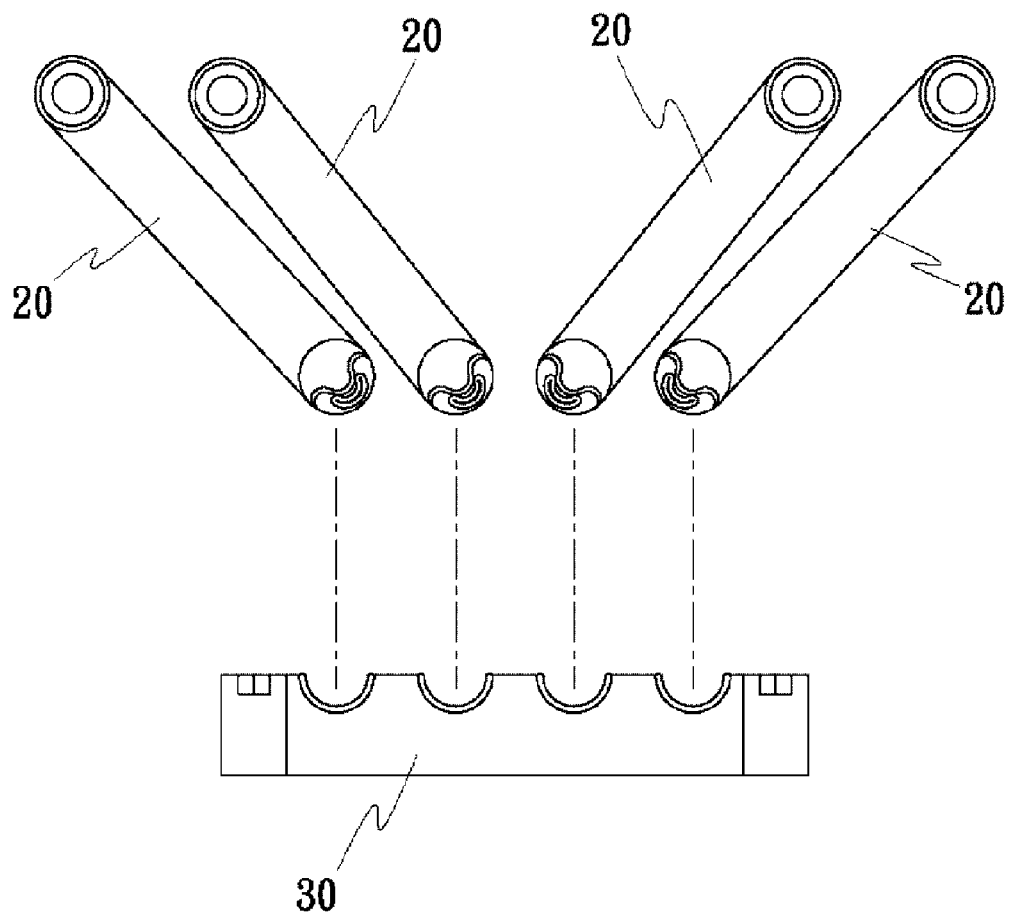
FIG. 13 is an exploded view of the prior art heat dissipating tubes and seat before assembly.

Similarly, as illustrated in FIGS. 11 and 12, the tube body of the heat dissipating tube 2 can be formed with an elliptical lower leg 21b. The seat 3 is formed with corresponding semi-elliptical slots 31b and the fins 1 are formed with a plurality of semi-elliptical notches 13b and elliptical lower penetrating holes 12b. The shaping sheets 311 can be pressed and bent to tightly fold around the elliptical lower leg 21b so that the heat dissipating tube 2 is tightly enclosed by the seat 3. The notch 13b of the fin 1 therefore in close contact with the elliptical lower leg 21b of the heat dissipating tubes 2 to achieve improved heat dissipating effect.

The preferred embodiments of the present invention have been described above; however, it will be obvious that the same may be varied in many ways. Such variations are not to be regarded as a departure from the spirit and scope of the present invention, and all such modifications as would be equivalent to one skilled in the art are intended to be covered within the scope of the following claims.

What is claimed is:

1. A heat dissipating module comprising:
a plurality of fins; the fins being stacked one by one; each fin having a plurality of upper penetrating holes; the upper penetrating holes of the fins being aligned to form a plurality of through holes; a lower side of each fin having a plurality of trenches;

a plurality of heat dissipating tubes sealed at two ends; and working liquid being filled in the tubes; and a seat being a solid metal seat; one end surface of the seat being formed with a plurality of slots corresponding to the trenches of the fin; two upper sides of each slot being extended with two shaping sheets; as the two shaping sheets being pressed and bent, with the slot of the seat, the two shaping sheets being formed with a round hole, wherein the plurality of heat dissipating tubes are embedded in the semi-circular slots of the seat and the two shaping sheets at two ends of semi-circular slot are pressed and bent to tightly fold around the heat dissipating tubes; two ends of the heat dissipating tubes pass through the upper penetrating holes and the trenches so that the fins are tightly pressed upon the seat, thereby enabling heat to be dissipated through the seat, heat dissipating tubes and the fins.

2. The heat dissipating module as claimed in claim 1, wherein the plurality of trenches are a plurality of lower penetrating holes or a plurality of lower semi-circular grooves.

3. The heat dissipating module as claimed in claim 1, wherein the trenches of the plurality of fins are semi-cambered grooves, semi-elliptical grooves or flat notches.

4. The heat dissipating module as claimed in claim 1, wherein the two shaping sheets are combined with two flat contact surfaces.

5. The heat dissipating module as claimed in claim 1, wherein the two shaping sheets are combined with two stepped contact surfaces.

6. The heat dissipating module as claimed in claim 1, wherein the two shaping sheets are combined with two inclined contact surfaces.

7. The heat dissipating module as claimed in claim 1, further comprising a fan locking frame enclosing a periphery of the plurality of fins.

8. The heat dissipating module as claimed in claim 7, wherein the fan locking frame is formed with two semi-frames; and each semi-frame has a lower support for fixing to one of connection portions disposed at two sides of the seat.

9. The heat dissipating module as claimed in claim 1, wherein the fins in a first section have upper penetrating holes and lower semi-circular grooves;

the fins in a second section have upper penetrating holes and lower penetrating holes;

the fins in a third section are identical to the fins in the first section; and the fins in a fourth section have only upper penetrating holes;

and wherein the heat dissipating tubes pass through the upper penetrating holes and the lower penetrating holes of the fins in the third section such that the heat dissipating tubes press on the fins in the first and third sections and thus all the heat dissipating fins are tightly engaged with the seat.

10. The heat dissipating module as claimed in claim 1, wherein the slots of the seat are semi-cambered slots, semi-elliptical slots or flat notches.

* * * * *